United States Patent
Endo (10) Patent No.: US 11,226,368 B2
(45) Date of Patent: Jan. 18, 2022

(54) PLACEMENT APPARATUS CONTROL METHOD, PLACEMENT APPARATUS, AND INSPECTION APPARATUS

(71) Applicant: Tokyo Electron Limited, Tokyo (JP)

(72) Inventor: Tomoya Endo, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/997,144

(22) Filed: Aug. 19, 2020

(65) Prior Publication Data
US 2021/0063477 A1 Mar. 4, 2021

(30) Foreign Application Priority Data
Aug. 26, 2019 (JP) .............................. JP2019-154025

(51) Int. Cl.
*G01R 31/28* (2006.01)

(52) U.S. Cl.
CPC ................................ *G01R 31/2887* (2013.01)

(58) Field of Classification Search
CPC ............ G01R 31/2806; G01R 31/2808; G01R 31/2865; G01R 31/2867; G01R 31/2886; G01R 31/2887; G01R 31/2893
See application file for complete search history.

(56) References Cited

U.S. PATENT DOCUMENTS

| | | | | |
|---|---|---|---|---|
| 4,775,281 A | * | 10/1988 | Prentakis | B23Q 7/048 118/500 |
| 5,404,894 A | * | 4/1995 | Shiraiwa | H01L 21/67167 118/500 |
| 5,658,115 A | * | 8/1997 | Yamazaki | H01L 21/67069 414/751.1 |
| 6,305,895 B1 | * | 10/2001 | Ozawa | H01L 21/67742 414/217 |
| 6,991,419 B2 | * | 1/2006 | Kim | B25J 18/02 414/680 |

(Continued)

FOREIGN PATENT DOCUMENTS

| JP | 2007187567 A | * | 7/2007 |
|---|---|---|---|
| JP | 2010074183 A | * | 4/2010 |

(Continued)

*Primary Examiner* — Patrick Assouad
*Assistant Examiner* — Demetrius R Pretlow
(74) *Attorney, Agent, or Firm* — Nath, Goldberg & Meyer; Jerald L. Meyer; Tanya E. Harkins (57) ABSTRACT

A method of controlling a placement apparatus including a stage, a support table, a rotary drive mechanism rotating the stage including a first motion conversion mechanism configured to convert a rotary motion of a drive motor into a linear motion of a moving body and a second motion conversion mechanism configured to convert a linear motion of the moving body into a rotary motion of the stage, and a controller. The method includes a first correction step of calculating a first correction value of a drive angle of the stage for a linear movement amount of the moving body, a second correction step of obtaining a second correction value based on an error for each predetermined pitch, and a drive step of rotationally driving the stage based on the first and second correction values obtained in the first correction step and the second correction step.

15 Claims, 7 Drawing Sheets

(56) References Cited

U.S. PATENT DOCUMENTS

| | | | | |
|---|---|---|---|---|
| 8,623,765 B2* | 1/2014 | Ozawa | ............. | H01L 21/67173 |
| | | | | 438/689 |
| 9,111,977 B2* | 8/2015 | Coxon | ............. | H01L 21/67742 |
| 2017/0137765 A1* | 5/2017 | Tamura | ................. | C12M 41/14 |

FOREIGN PATENT DOCUMENTS

| | | | | |
|---|---|---|---|---|
| JP | 2010074183 A | | 4/2010 | |
| WO | WO-0045432 A1 * | | 8/2000 | ............. H01L 21/68 |

* cited by examiner

PLACEMENT APPARATUS CONTROL METHOD, PLACEMENT APPARATUS, AND INSPECTION APPARATUS

CROSS-REFERENCE TO RELATED APPLICATION

This application is based upon and claims the benefit of priority from Japanese Patent Application No. 2019-154025, filed on Aug. 26, 2019, the entire contents of which are incorporated herein by reference.

TECHNICAL FIELD

The present disclosure relates to a placement apparatus control method, a placement apparatus, and an inspection apparatus.

BACKGROUND

A substrate inspection apparatus is known that inspects electrical characteristics of a semiconductor device by placing a wafer on which a semiconductor device is formed on a placement apparatus, and supplying a current to the semiconductor device from a tester via a probe or the like.

Patent Document 1 discloses a placement mechanism configured to adjust the rotation direction of a target object.

PRIOR ART DOCUMENT

Patent Document

Patent Document 1: Japanese Laid-Open Patent Publication No. 2010-74183

SUMMARY

According to embodiments of the present disclosure, there is provided a method of controlling a placement apparatus including a stage configured to place an target object thereon, a support table configured to support the stage to be rotatable forward and backward, a rotary drive mechanism configured to rotate the stage including a first motion conversion mechanism configured to convert a rotary motion of a drive motor into a linear motion of a moving body and a second motion conversion mechanism configured to convert a linear motion of the moving body into a rotary motion of the stage, and a controller configured to control the rotary drive mechanism, wherein the method includes: a first correction step of calculating a first correction value of a drive angle of the stage for a linear movement amount of the moving body; a second correction step of obtaining a second correction value based on an error for each predetermined pitch; and a drive step of rotationally driving the stage based on the first correction value and the second correction value obtained in the first correction step and the second correction step, respectively.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components are denoted by the same reference numerals, and redundant descriptions may be omitted.

[Substrate Inspection Apparatus]

A substrate inspection apparatus according to an embodiment of the present disclosure will be described. The substrate inspection apparatus according to an embodiment of the present disclosure is an apparatus in which a plurality of cells are mounted and each of the plurality of cells is capable of independently and simultaneously inspecting a semiconductor wafer (hereinafter referred to as a "wafer"), which is a substrate. The substrate inspection apparatus is not limited to this, and may be, for example, an apparatus that inspects one wafer.

Figure 1:
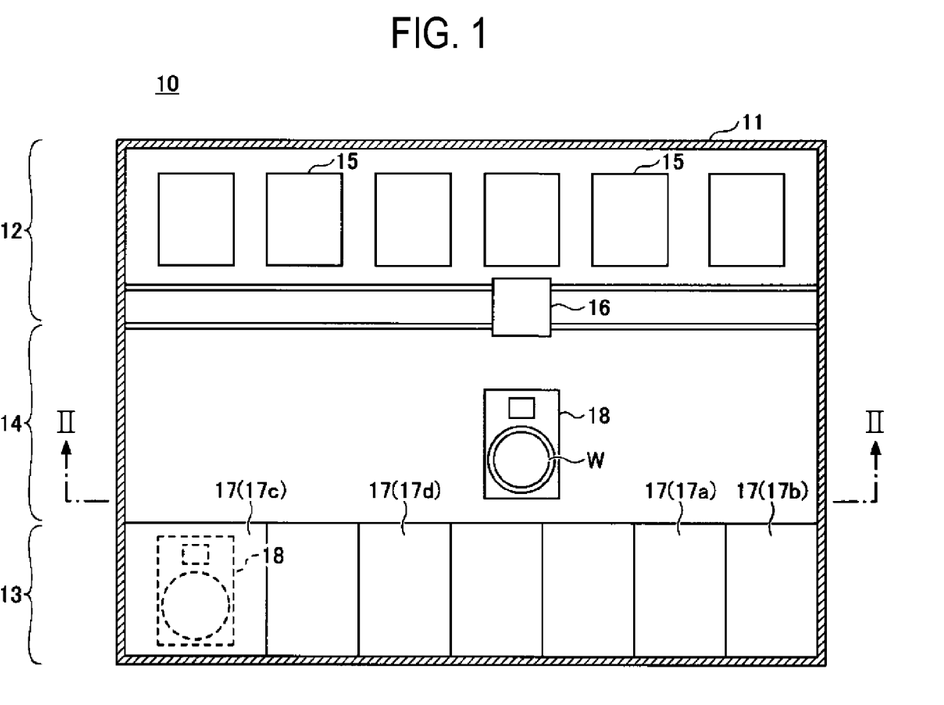
FIG. 1 is a schematic view of a substrate inspection apparatus according to an embodiment.
Figure 2:
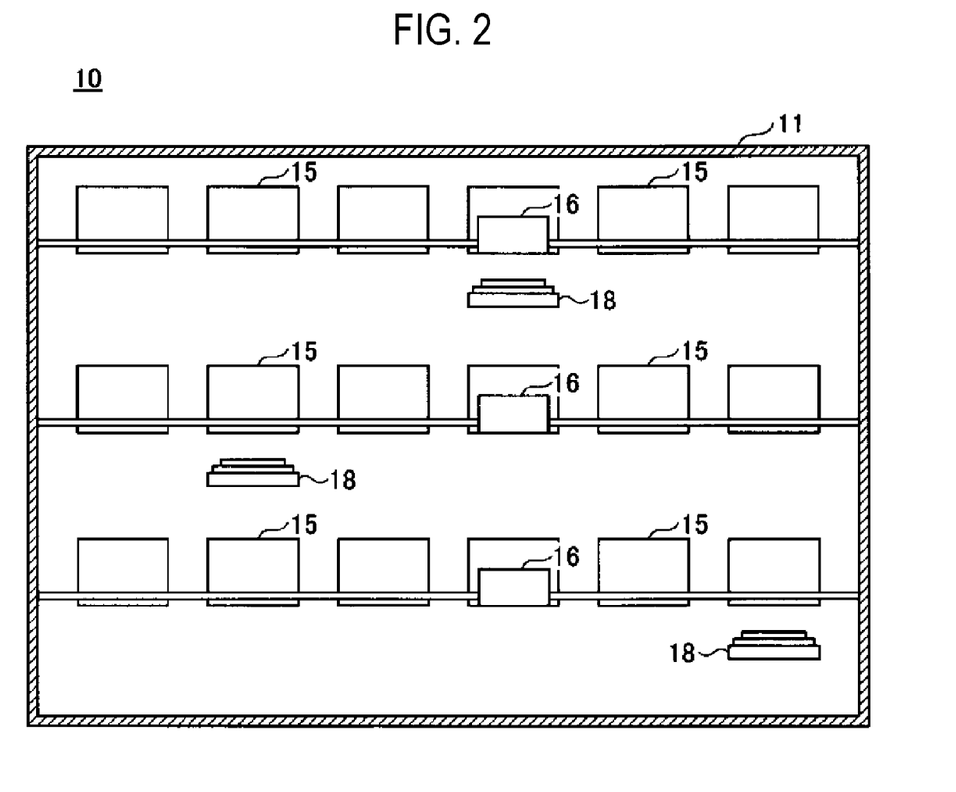
FIG. 2 is a schematic view of a substrate inspection apparatus according to the embodiment.

FIGS. 1 and 2 are schematic views of a substrate inspection apparatus according to an embodiment of the present disclosure. FIG. 1 illustrates a horizontal cross section of the substrate inspection apparatus, and FIG. 2 illustrates a cross section taken along the one-dot chain line II-II in FIG. 1.

As illustrated in FIGS. 1 and 2, the substrate inspection apparatus 10 includes an inspection room 11. The inspection room 11 has an inspection region 12, a loading/unloading region 13, and a transfer region 14.

The inspection region 12 is a region for inspecting electrical characteristics of each semiconductor device formed on a wafer W. A plurality of testers 15 as wafer inspection interfaces are arranged in the inspection region 12. Specifically, the inspection region 12 has a multi-stage structure of tester rows, each of which is composed of a plurality of horizontally arranged testers 15, for example, a three-stage structure, and one tester-side camera 16 is arranged corresponding to each tester row. Each tester-side camera 16 horizontally moves along the corresponding tester row and is positioned in front of each tester 15 constituting the tester row so as to identify the position of a wafer W or the like transferred by a transfer stage (a placement apparatus) 18 and the degree of inclination of a chuck top 50 to be described later.

The loading/unloading region 13 is a region for loading/unloading a wafer W to/from the inspection room 11. The loading/unloading region 13 is divided into a plurality of accommodation spaces 17. A port 17a, an aligner 17b, a loader 17c, and a controller 17d are arranged in each accommodation space 17. A FOUP, which is a container accommodating a plurality of wafers W, is received through the port 17a. The aligner 17b aligns the wafer W. The loader 17c performs loading/unloading of a probe card. The controller 17d controls the operation of each part of the substrate inspection apparatus 10.

The transfer region 14 is a region provided between the inspection region 12 and the loading/unloading region 13. In the transfer region 14, the transfer stage 18 is arranged to be movable not only in the transfer region 14 but also to the inspection region 12 and the loading/unloading region 13. One transfer stage 18 is provided corresponding to each stage row. The transfer stage 18 receives a wafer W from the port 17a of the loading/unloading region 13 and transfers the wafer W to each tester 15. Further, the transfer stage 18 transfers the wafer W, for which the electrical characteristics of semiconductor devices have been inspected, from each tester 15 to the port 17a.

In the substrate inspection apparatus 10, each tester 15 inspects the electrical characteristics of each semiconductor device of a transferred wafer W. While the transfer stage 18 transfers a wafer W to one tester 15, another tester 15 may inspect the electrical characteristics of each semiconductor device on another wafer W. Therefore, inspection efficiency of wafers W is improved.

Figure 3:
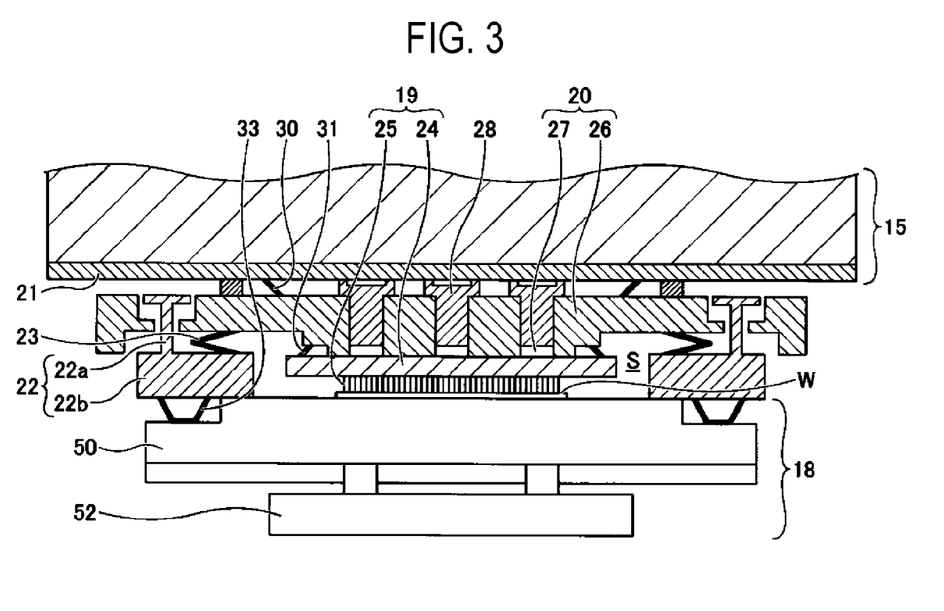
FIG. 3 is an exemplary explanatory view illustrating a tester and a transfer stage of a substrate inspection apparatus according to the embodiment.

FIG. 3 is an explanatory view illustrating a tester 15 and a transfer stage 18 of a substrate inspection apparatus 10 according to the present embodiment. FIG. 3 illustrates a state in which a wafer W is in contact with a probe card 19 of the tester 15 by the transfer stage 18.

As illustrated in FIG. 3, the tester 15 is installed on a pogo frame 20 fixed to an apparatus frame (not illustrated). A probe card 19 is mounted on the bottom of the pogo frame 20. A flange 22 that is vertically movable with respect to the pogo frame 20 is engaged with the pogo frame 20. A cylindrical bellows 23 is interposed between the pogo frame 20 and the flange 22.

The probe card 19 includes a disk-shaped body 24, a large number of electrodes (not illustrated) arranged on almost entire portions of the top surface of the body 24, and a large number of contact probes (contact terminals) 25 arranged so as to protrude downward from the bottom surface of the body 24 in the drawing. Each electrode is connected to each corresponding contact probe 25, and when a wafer W comes into contact with the probe card 19, each contact probe 25 is brought into electrical contact with an electrode pad or a solder bump of each semiconductor device formed on the wafer W. A large number of contact probes 25 are configured to be capable of coming into collective contact with, for example, the entire surface of the wafer W. As a result, the electrical characteristics of a large number of semiconductor devices can be inspected at the same time, and thus the inspection time can be shortened.

The pogo frame 20 has a substantially flat-plate-shaped body 26 and a plurality of pogo block insertion holes 27, which are through holes formed near the center of the body 26. A pogo block 28, which is formed by arranging a large number of pogo pins, is inserted into each pogo block insertion hole 27. The pogo block 28 is connected to an inspection circuit (not illustrated) included in the tester 15 and comes into contact with a large number of electrodes on the top surface of the body 24 of the probe card 19 mounted on the pogo frame 20. The pogo block 28 supplies a current to each contact probe 25 of the probe card 19 connected to the electrodes, and directs the current flowing from the electric circuit of each semiconductor device of the wafer W to the inspection circuit through each contact probe 25.

The flange 22 has a cylindrical body 22a and an abutment portion 22b configured as an annular member formed on the bottom portion of the body 22a, and is arranged to surround the probe card 19. Until the chuck top 50 comes into contact, the flange 22 moves downward by its own weight such that the bottom surface of the abutment portion 22b is located below the tip end of each contact probe 25 of the probe card 19.

The bellows 23 is a metal bellows structure, and is configured to be extendable in the vertical direction. A lower end and an upper end of the bellows 23 are in close contact with the top surface of the abutment portion 22b of the flange 22 and the bottom surface of the pogo frame 20, respectively.

In the tester 15, the space between the pogo frame 20 and the base 21 is sealed by a seal member 30, and the space is vacuumized, so that the pogo frame 20 is mounted on the base 21. The space between the probe card 19 and the pogo frame 20 is also sealed by the seal member 31 and the space is vacuumized, so that the probe card 19 is mounted on the pogo frame 20.

The transfer stage 18 is an example of a placement apparatus, and has a chuck top 50, which is a thick plate member, and a bottom plate 52. The chuck top 50 is mounted on the bottom plate 52, and a wafer W is placed on the top surface of the chuck top 50. The chuck top 50 is adsorbed to the bottom plate 52 by vacuum suction, and the wafer W is adsorbed to the chuck top 50 by vacuum suction. Accordingly, when the transfer stage 18 moves, the wafer W can be prevented from moving relative to the transfer stage 18. The method of holding the chuck top 50 and the wafer W is not limited to vacuum suction, and any method may be used as long as the method can prevent relative movement of the chuck top 50 and the wafer W with respect to the bottom plate 52. For example, the chuck top 50 and the wafer W may be held by electromagnetic attraction or a clamp. A seal member 33 is arranged on the outer peripheral portion of the top surface of the chuck top 50.

Since the transfer stage 18 is movable, the transfer stage 18 can move to a position below the probe card 19 of the tester 15 so as to make the wafer W placed on the chuck top 50 face the probe card 19 and to move the wafer W toward the tester 15. When the chuck top 50 is brought into contact with the abutment portion 22b of the flange 22 and the wafer W is brought into contact with the probe card 19, a space S surrounded by the probe card 19, the pogo frame 20, the flange 22, and the chuck top 50 is formed. The space S is sealed by the bellows 23 and the seal member 33, and the space S is vacuumized, whereby the chuck top 50 is held by the probe card 19, and the wafer W placed on the chuck top 50 is brought into contact with the probe card 19. At this time, each of the electrode pads or solder bumps of the semiconductor devices on the wafer W comes into contact with a corresponding one of the contact probes 25 of the probe card 19. In the substrate inspection apparatus 10, the movement of the transfer stage 18 is controlled by the controller 17d, and the controller 17d detects the position and the movement amount of the transfer stage 18.

Figure 4:
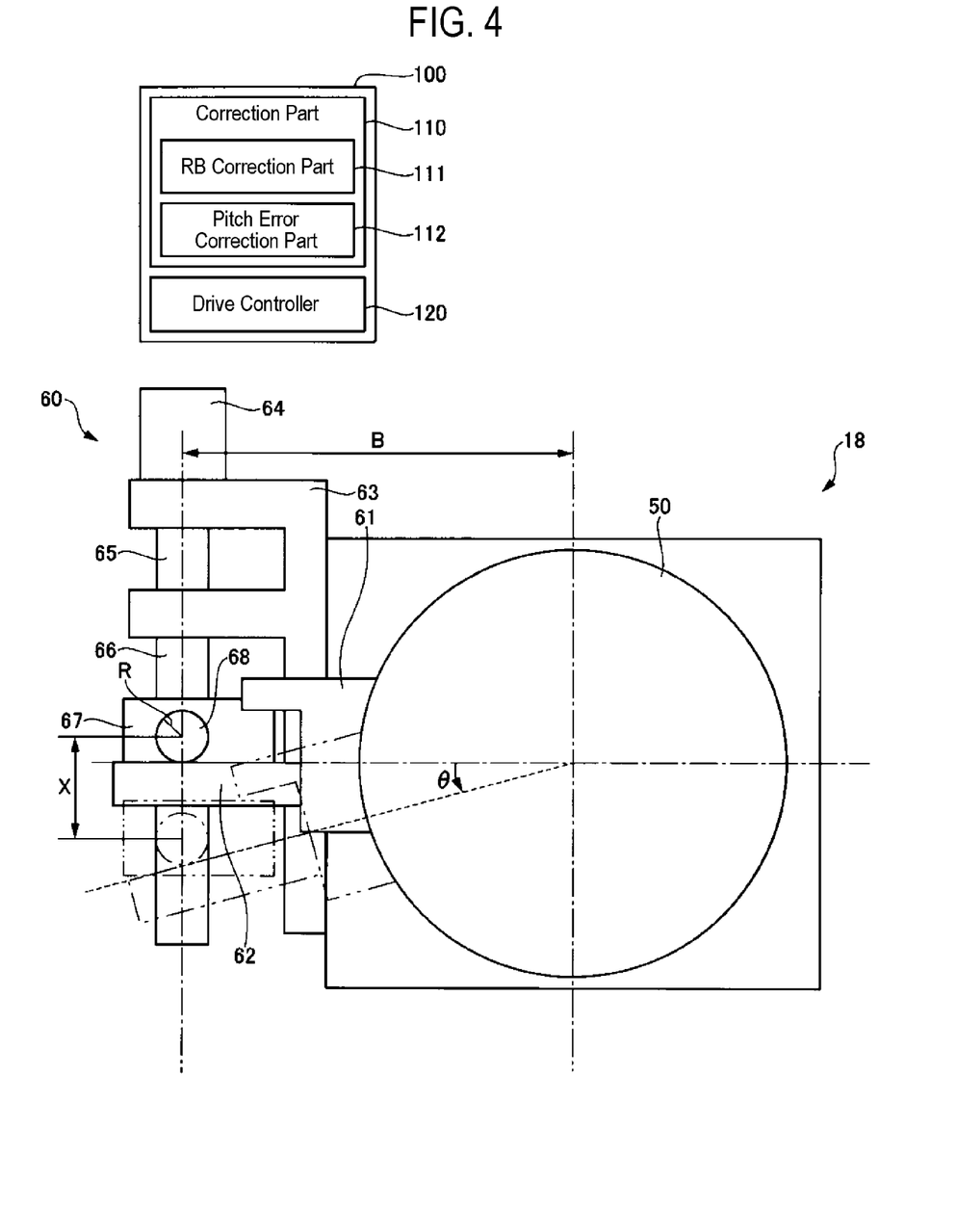
FIG. 4 is a plan view illustrating an exemplary transfer stage according to the embodiment.

Next, a rotary drive mechanism 60 for rotating the chuck top 50 on the transfer stage 18 will be further described with reference to FIG. 4. FIG. 4 is a plan view illustrating an exemplary transfer stage 18 according to the present embodiment.

The chuck top 50 is rotatably provided with respect to a bottom plate 52 using an axis perpendicular to the placement surface of the chuck top 50 as a rotation axis. The bottom plate 52 has a fixing mechanism (not illustrated) that fixes the rotation of the chuck top 50. The fixing mechanism fixes the chuck top 50 to the bottom plate 52 by, for example, vacuum suction, and fixes the rotation of the chuck top 50.

The rotary drive mechanism 60 includes a bracket 61, a shaft 62, a bracket 63, a drive motor 64, a coupling 65, a ball screw 66, a moving body 67 having a nut, and a cam follower 68.

A bracket 61 is provided on the outer peripheral side of the chuck top 50. The bracket 61 is provided with a shaft 62 extending in the radial direction of the chuck top 50. The bracket 61 and the shaft 62 rotate together with the chuck top 50. In addition, the shaft 62 also has an abutment surface that comes into contact with the cam follower 68. The abutment surface of the shaft 62 is provided such that the rotation axis of the chuck top 50 is located on the extension of the abutment surface.

The bracket 63 is provided on the bottom plate 52. The drive motor 64 is fixed to the bracket 63. The rotation shaft of the drive motor 64 is connected to the ball screw 66 via the coupling 65. The ball screw 66 is rotatably supported by the bracket 63. The moving body 67 has a nut (not illustrated) that is screw-coupled to the ball screw 66. The ball screw 66 and the nut of the moving body 67 constitute a ball-screw mechanism (a first movement conversion mechanism) that converts the rotary motion of the drive motor 64 into the linear motion of the moving body 67. As a result, when the drive motor 64 rotates forward and backward, the moving body 67 advances and retreats. The drive motor 64 includes an encoder (not illustrated) that detects the angle of the rotation shaft.

In the following description, it is assumed that the direction in which the moving body 67 moves away from the drive motor 64 is an advancing direction, and the direction in which the moving body 67 approaches the drive motor 64 is a retreating direction. In addition, it is assumed that the moving body 67 advances when the drive motor 64 rotates forward (clockwise rotation, CW) and retreats when the drive motor 64 rotates backward (counterclockwise rotation, CCW).

A cam follower 68 is provided on the moving body 67. The cam follower 68 comes into contact with the abutment surface of the shaft 62. As illustrated by the two-dot chain line in FIG. 4, when the moving body 67 advances, the cam follower 68 slides on the abutment surface of the shaft 62, and the chuck top 50 rotates counterclockwise.

A biasing member (not illustrated), such as a spring, is provided between the shaft 62 and the moving body 67. The biasing member urges the shaft 62 in a direction to pull the shaft 62 toward the moving body 67. As a result, when the moving body 67 retreats, the shaft 62 is pulled toward the moving body 67 by the biasing member, and the chuck top 50 rotates clockwise.

As described above, the cam follower 68, the shaft 62, and the biasing member constitute a motion conversion mechanism (a second motion conversion mechanism) that converts the linear motion of the moving body 67 into the rotary motion of the chuck top 50.

As described above, the rotary drive mechanism 60 is capable of rotating the chuck top 50 by controlling the drive motor 64.

Here, as illustrated in FIG. 4, it is assumed that the radius of the cam follower 68 is R, the distance between the center (rotation axis) of the chuck top 50 and the center (rotation axis) of the cam follower 68 is B, the linear movement amount of the cam follower 68 is X, and the drive angle of the chuck top 50 is $\theta$. The relationship between the linear movement amount X of the cam follower 68 and the drive angle $\theta$ of the chuck top 50 may be expressed by the equation (1) below. The radius R and the distance B are given as design values.

In the following description, the linear movement amount X of the cam follower 68 will be described assuming that the direction in which the moving body 67 retreats is positive and the direction in which the moving body 67 advances is negative. In addition, the drive angle $\theta$ of the chuck top 50 will be described assuming that the direction in which the chuck top 50 rotates clockwise is positive and the direction in which the chuck top 50 rotates counterclockwise is negative. In addition, the state indicated by the solid line in FIG. 4 will be described assuming that the linear movement amount X=0 and the drive angle $\theta$=0. In FIG. 4, the example indicated by the two-dot chain lines represents an example in which the values of the linear movement amount X and the drive angle $\theta$ are negative.

$$X=(B \sin \theta + R)/\cos \theta - R \qquad (1)$$

The controller 100 has a correction part 110 and a drive controller 120. The controller 100 may be provided in the controller 17d of the substrate inspection apparatus 10, or may be provided separately from the controller 17d.

The correction part 110 corrects the drive angle $\theta$ with respect to the linear movement amount X. This reduces an error between a target drive angle $\theta$ and an actual drive angle $\theta$ when the rotary drive mechanism 60 is controlled so as to reach the target drive angle $\theta$. The correction part 110 includes an RB correction part 111 and a pitch error correction part 112.

The RB correction part 111 performs RB correction. Here, the RB correction is performed by correcting the drive angle $\theta$ with respect to the linear movement amount X by correcting the radius R and the distance B, which are the coefficients of equation (1), from design values. The RB correction is applied within the entire stroke range of the drive angle $\theta$.

An exemplary method for obtaining correction values for the radius R and the distance B in the RB correction will be described. At the start of the RB correction, a wafer W, having a marker attached thereto for detecting the drive angle $\theta$ by imaging using the tester-side camera 16, is mounted on the chuck top 50.

The RB correction part 111 calculates the linear movement amount X for rotating the drive angle $\theta$ of the chuck top 50 by a predetermined first angle (e.g., +1°) from the current radius $R_0$ (a set value) and the distance $B_0$ (a set value) and the relational equation (1). Based on the calculated linear movement amount X, the RB correction part 111 controls the drive motor 64. The RB correction part 111 acquires an image of the wafer W captured by the tester-side camera 16. The RB correction part 111 obtains an actual measurement value of the drive angle $\theta$ by image recognition based on the acquired image.

Similarly, the RB correction part 111 calculates the linear movement amount X for rotating the drive angle $\theta$ of the chuck top 50 by a predetermined second angle (e.g., −1°)

from the current radius $R_0$ (a set value) and the distance $B_0$ (a set value) and the relational equation (1). Based on the calculated linear movement amount X, the RB correction part 111 controls the drive motor 64. The RB correction part 111 acquires an image of the wafer W captured by the tester-side camera 16. The RB correction part 111 obtains an actual measurement value of the drive angle θ by image recognition based on the acquired image.

In addition, the first angle and the second angle may be set to the maximum value and the minimum value, for example, in the range used for alignment. Further, the points for acquiring data are not limited to two points (the first angle and the second angle), and may be three or more points.

The RB correction part 111 obtains a correction value $R_C$ of the radius R and a correction value $B_C$ of the distance B, based on the actual measurement value of the linear movement amount X calculated from a detection value of an encoder of the drive motor 64 and the actual measurement value of the drive angle θ calculated by image recognition from the image of the wafer W.

Next, the RB correction part 111 calculates the linear movement amount X for rotating the drive angle θ of the chuck top 50 by a predetermined first angle (e.g., +1°) from the corrected radius R (=$R_0$+$R_C$) and the corrected distance B (=$B_0$+$B_C$) and relational equation (1). Based on the calculated linear movement amount X, the RB correction part 111 controls the drive motor 64. The RB correction part 111 acquires an image of the wafer W captured by the tester-side camera 16. The RB correction part 111 obtains an actual measurement value of the drive angle θ by image recognition based on the acquired image.

Similarly, the RB correction part 111 calculates the linear movement amount X for rotating the drive angle θ of the chuck top 50 by a predetermined second angle (e.g., −1°) from the corrected radius R (=$R_0$+$R_C$) and the corrected distance B (=$B_0$+$B_C$) and relational equation (1). Based on the calculated linear movement amount X, the RB correction part 111 controls the drive motor 64. The RB correction part 111 acquires an image of the wafer W captured by the tester-side camera 16. The RB correction part 111 obtains an actual measurement value of the drive angle θ by image recognition based on the acquired image.

In either of the first angle or the second angle, the RB correction part 111 repeats the correction of the radius R and the distance B until the error between the target value (the first angle or the second angle) of the drive angle θ and the actual measurement value of the drive angle θ falls within a predetermined range (e.g., ±1/100000°).

In addition, when the radius R and the distance B at which the error falls within a predetermined range are obtained, data may be continuously acquired a plurality of times (e.g., 10 times) using the radius R and the distance B so as to identify whether the error falls within the predetermined range (e.g., ±1/100000°). When the error does not fall within the predetermined range, the radius R and the distance B may be corrected again.

In this way, the RB correction part 111 may obtain the correction value $R_C$ of the radius R and the correction value $B_C$ of the distance B.

Figure 5:
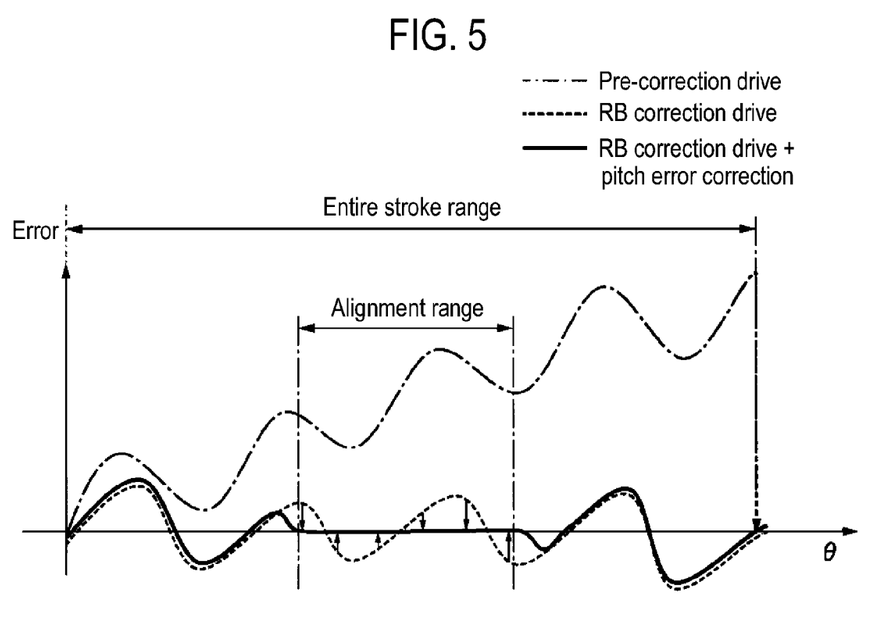
FIG. 5 is an exemplary graph showing an effect of correction.

FIG. 5 is an exemplary graph showing an effect of correction. The horizontal axis represents the drive angle θ. The vertical axis represents the error between the target drive angle θ and the actual drive angle θ. The waveform of pre-correction drive is indicated by a one-dot chain line. In the pre-correction drive, the rotary drive mechanism 60 is controlled using design values $R_0$ and $B_0$ as the radius R and the distance B in equation (1). In the pre-correction drive, errors are accumulated, and the error increases as the drive angle θ increases.

The waveform of RB correction drive is indicated by a broken line. In the RB correction drive, the rotary drive mechanism 60 is controlled using the radius R after RB correction (=R0+RC) and the distance B after RB correction (=B0+BC) as the radius R and the distance B of equation (1). In the RB correction drive, the cumulative error may be suppressed in the entire stroke range of the drive angle θ.

Returning to FIG. 4, the pitch error correction part 112 performs pitch error correction. Here, the pitch error correction is performed by applying a correction value table having a correction value for each predetermined pitch within a range used for alignment.

An exemplary method for obtaining a correction value table in the pitch error correction will be described. At the start of the pitch error correction, a wafer W, having a marker attached thereto for detecting the drive angle θ by imaging using the tester-side camera 16, is mounted on the chuck top 50.

In a range used for alignment (e.g., −1° to +1°), the pitch error correction part 112 acquires an image of the wafer W captured using the tester-side camera 16 by rotating the chuck top 50 for each predetermined pitch (e.g., −1/100000°) using the relational equation (1) after the RB correction. The pitch error correction part 112 obtains an actual measurement value of the drive angle θ by image recognition, based on the acquired image. The pitch error correction part 112 obtains an error between the target drive angle θ and the actual drive angle θ at each pitch, and generates a correction value table in which the correction value is associated with each pitch.

Here, further explanation will be given with reference to FIG. 5. In the waveform of the RB correction drive indicated by the broken line, a periodic error occurs as the ball screw 66 rotates. A drive waveform in which the pitch error correction is applied on the RB correction is shown by a solid line. In the drive in which the pitch error correction is applied on the RB correction, outside the range used for alignment, the rotary drive mechanism 60 is controlled using the radius R after RB correction (=R0+RC) and the distance B after RB correction (=B0+BC) as the radius R and the distance B in the equation (1), as in the RB correction drive. In addition, within the range used for alignment, the rotary drive mechanism 60 is controlled by performing the pitch error correction in addition to the RB correction drive, that is, by applying the correction value table. In addition, between the pitches described in the correction value table, a correction value is derived by interpolating from the correction values of two adjacent points. In the drive in which the pitch error correction is applied on the RB correction, it is possible to further reduce the error by canceling a periodic error caused due to the rotation of the ball screw 66 within the range used for the alignment.

The substrate inspection apparatus 10 acquires in advance correction values RC and BC used for RB correction and a correction value table used for pitch error correction. In inspecting a wafer W by the substrate inspection apparatus 10, the drive controller 120 is capable of accurately aligning the wafer W placed on the chuck top 50 with the probe card 19 by controlling the drive motor 64 based on the relational equation between the linear movement amount X and the drive angle θ corrected by the correction unit 110.

Figure 6:
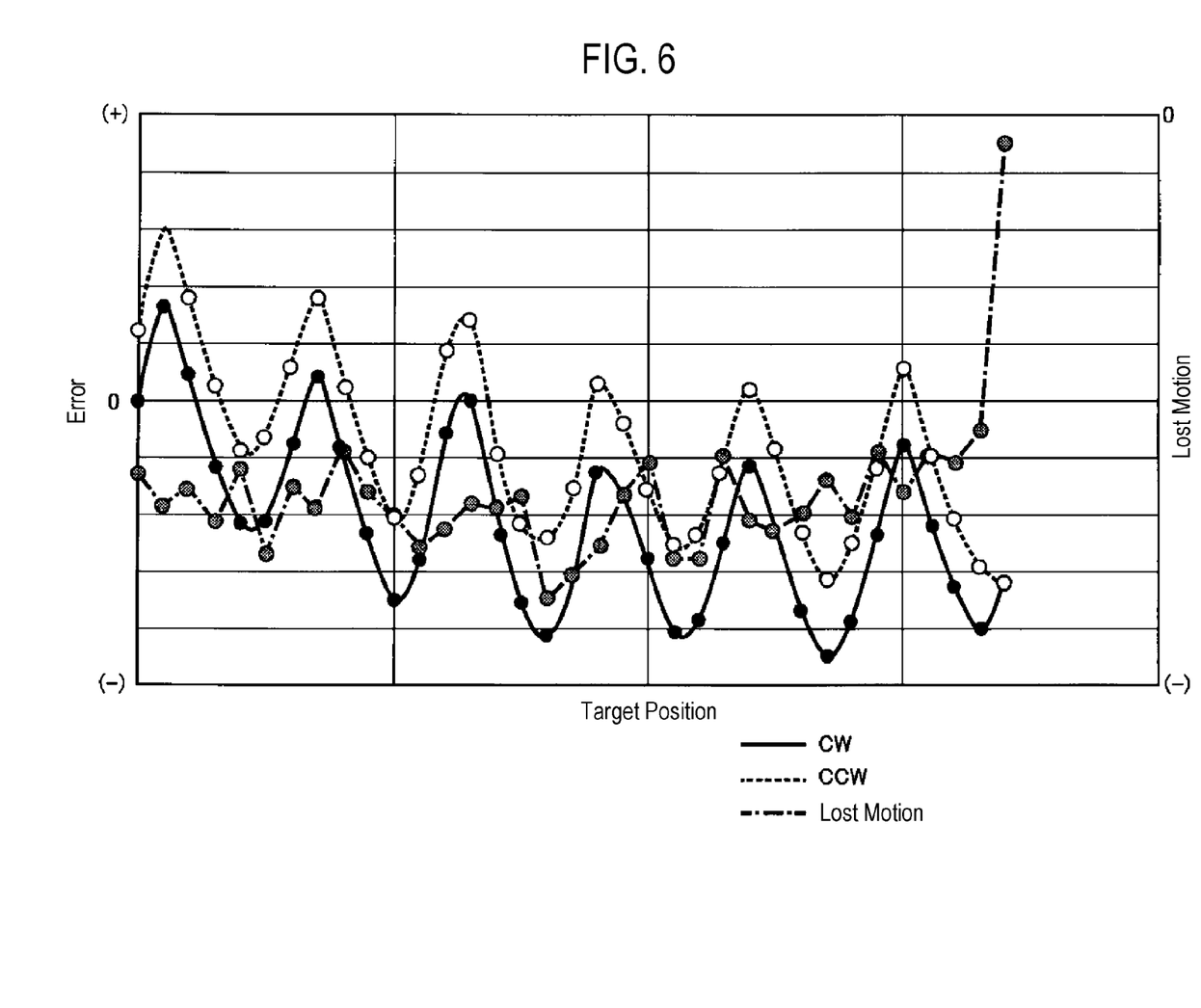
FIG. 6 is an exemplary graph illustrating an error when a moving body retreats and advances.

FIG. 6 is an exemplary graph illustrating an error when the moving body 67 advances and retreats. The forward rotation (CW) of the drive motor 64 is indicated by a solid line, and the backward rotation (CCW) of the drive motor 64 is indicated by a broken line. In addition, a lost motion, which is the difference between the forward rotation (CW) and the backward rotation (CCW), is indicated by a one-dot chain line. As shown in FIG. 6, there is a difference in the operation of the moving body 67 between the forward rotation and the backward rotation of the drive motor 64. That is, the operation of the moving body 67 is partially lost when the drive motor 64 rotates backward compared with the forward rotation of the drive motor 64. Such a difference in operation is caused by, for example, backlash of the ball screw 66 or a contact state between the cam follower 68 and the shaft 62.

Figure 7:
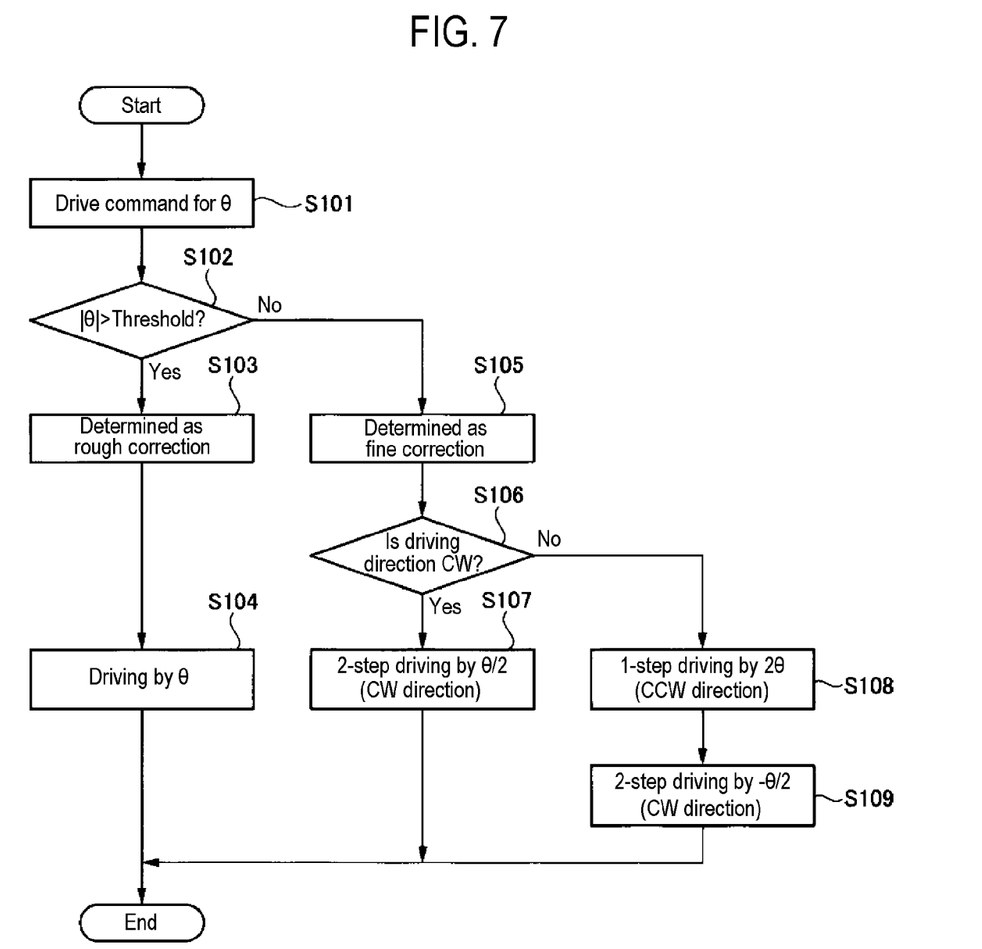
FIG. 7 is a flow chart illustrating the operation of a drive controller.

Next, control of the rotary drive mechanism 60 by the drive controller 120 will be described with reference to FIG. 7. FIG. 7 is a flowchart illustrating the operation of the drive controller 120.

In step S101, the drive controller 120 receives a drive command input for a drive angle θ.

In step S102, the drive controller 120 determines whether or not the absolute value of the commanded drive angle θ is larger than a predetermined threshold (e.g., 1000/10000°). When the absolute value is larger than the threshold, the process of the drive controller 120 proceeds to step S103. When the absolute value is not larger than the threshold, the process of the drive controller 120 proceeds to step S105.

In step S103, the drive controller 120 determines that the drive command is a rough correction. Then, in step S104, the drive controller 120 drives the drive motor 64 such that the chuck top 50 rotates at the drive angle θ. That is, the drive controller 120 obtains a linear movement amount $X_1$ necessary for the drive angle θ based on the relational equation in which the pitch error correction is applied on the RB correction. Then, the drive controller 120 drives the drive motor 64 such that the moving body 67 moves by the linear movement amount $X_1$.

In step S105, the drive controller 120 determines that the drive command is a fine correction.

In step S106, the drive controller 120 determines whether or not the drive direction of the drive command is the forward rotation (CW) direction. When the drive direction is the forward rotation (CW) direction (S106, "Yes"), the process of the drive controller 120 proceeds to step S107. When the drive direction is not the forward rotation (CW) direction (S106, "No"), the process of the drive controller 120 proceeds to step S108.

In step S107, the drive controller 120 rotates the drive motor 64 forward (CW) based on the drive command such that the chuck top 50 rotates at the drive angle θ. At this time, the drive controller 120 rotates the chuck top 50 at the drive angle θ in two steps in which the chuck top 50 is rotated at a drive angle θ/2 and is further rotated at a drive angle θ/2. That is, the drive controller 120 obtains a linear movement amount $X_2$ necessary for the drive angle θ based on the relational equation in which the pitch error correction is applied on the RB correction. Then, the drive controller 120 drives the drive motor 64 such that the moving body 67 moves by the linear movement amount $X_2/2$. Thereafter, the drive controller 120 drives the drive motor 64 such that the moving body 67 further moves by a linear movement amount $X_2/2$. As a result, the moving body 67 is moved by the linear movement amount $X_2$.

In step S108, the drive controller 120 rotates the drive motor 64 backward (CCW) such that the chuck top 50 rotates at a drive angle 2θ. That is, the drive controller 120 obtains a linear movement amount $X_3$ necessary for the drive angle 2θ based on the relational equation in which the pitch error correction is applied on the RB correction. Then, the drive controller 120 drives the drive motor 64 such that the moving body 67 moves by the linear movement amount $X_3$.

In step S109, the drive controller 120 rotates the drive motor 64 forward (CW) such that the chuck top 50 rotates by a drive angle −θ. At this time, the drive controller 120 rotates the chuck top 50 by the drive angle θ in two steps in which the chuck top 50 is rotated at a drive angle −θ/2 and is further rotated at a drive angle −θ/2. That is, the drive controller 120 obtains a linear movement amount $X_4$ necessary for the drive angle θ based on the relational equation in which the pitch error correction is applied on the RB correction. Then, the drive controller 120 drives the drive motor 64 such that the moving body 67 moves by a linear movement amount $X_4/2$. Thereafter, the drive controller 120 drives the drive motor 64 such that the moving body 67 further moves by the linear movement amount $X_4/2$. As a result, the moving body 67 is moved by the linear movement amount $X_4$.

As described above, according to the control of the drive controller 120, when it is determined that a rough correction is requested, the drive motor 64 is controlled to be driven as is according to the drive command of the drive angle θ. As a result, it is possible to enhance the responsiveness until the rotation of the chuck top 50 is completed.

On the other hand, when it is determined that a fine correction is requested, the rotation direction of the drive motor 64 at the end of driving is set to the forward rotation (CW) direction. That is, the direction in which the cam follower 68 advances toward the shaft 62 is set. When the commanded drive angle θ is in the backward rotation (CCW) direction of the drive motor 64, the drive motor 64 is driven in the backward rotation (CCW) direction so as to exceed the target drive angle θ, and then the drive motor 64 is driven in the forward rotation (CW) direction such that the target drive angle θ is obtained. As a result, it is possible to prevent the occurrence of a difference between the forward rotation and the backward rotation as shown in FIG. 6 and to improve the alignment accuracy.

In addition, in the fine correction, driving is performed in two steps. This reduces the inertial force compared with the case where driving is performed in one step. That is, even if the rotation of the ball screw 66 is stopped by stopping the rotation of the drive motor 64, the moving body 67 may advance slightly due to the inertial force. Even if the moving body 67 (the cam follower 68) stops, the chuck top 50 may rotate slightly due to the inertial force. In contrast, by performing driving in two steps, it is possible to reduce the inertial force and thus to further reduce the error.

In steps S107 and S109, the drive controller 120 has been described as being driven in two steps, but the present disclosure is not limited thereto. The drive controller 120 may perform driving in one step, that is, rotate the chuck top 50 at the drive angle θ at once. Even in this case, it is possible to prevent the occurrence of a difference between the forward rotation and the backward rotation, and to improve alignment accuracy.

Further, in steps S107 and S109, the drive controller 120 may perform the process of driving in a plurality of steps, for example, by repeating the process of rotating the chuck top 50 at a drive angle θ/N (for example, by setting N to an integer of 2 or more) N times. As a result, it is possible to reduce the inertial force, and thus to further reduce the error. In addition, when the driving is performed in a plurality of steps, the drive angle for each driving is not limited to the case of equal division, and may be different.

In the foregoing, the film forming method of the present embodiment using the substrate inspection apparatus 10 has been described. However, the present disclosure is not limited to the above-described embodiment or the like, and can be variously modified and improved within the scope of the present disclosure described in the claims.

Although the second motion conversion mechanism has been described as including the cam follower 68 and the shaft 62, it is not limited thereto. The second motion conversion mechanism may be, for example, a link mechanism.

Although the tester-side camera 16 has been described as being used as the position detection device that detects the actual measurement value of the drive angle θ, the present disclosure is not limited thereto, and another detector may be used. For example, an encoder (not illustrated) that detects the rotation angle of the chuck top 50 may be used.

According to an aspect, it is possible to provide a placement apparatus control method, a placement apparatus, and an inspection apparatus in which alignment in a rotational direction is accurately performed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of controlling a placement apparatus including a stage configured to place a target object thereon, a support table configured to support the stage to be rotatable forward and backward, a rotary drive mechanism configured to rotate the stage including a first motion conversion mechanism configured to convert a rotary motion of a drive motor into a linear motion of a moving body and a second motion conversion mechanism configured to convert a linear motion of the moving body into a rotary motion of the stage, and a controller configured to control the rotary drive mechanism, wherein the method comprises:
   a first correction step of calculating a first correction value of a drive angle of the stage for a linear movement amount of the moving body;
   a second correction step of obtaining a second correction value based on an error for each predetermined pitch; and
   a drive step of rotationally driving the stage based on the first correction value and the second correction value obtained in the first correction step and the second correction step, respectively.

2. The method of claim 1, wherein, in the first correction step, a coefficient of a relational equation of the linear movement amount of the moving body and the drive angle of the stage is corrected.

3. The method of claim 2, wherein, in the second correction step, the second correction value is obtained based on an error for each predetermined pitch within an alignment range.

4. The method of claim 3, wherein, in the drive step, whether a requested correction is a fine correction or a rough correction is determined based on the drive angle of the stage.

5. The method of claim 4, wherein, in the drive step, when a requested correction is determined to be a fine correction, alignment is completed when a rotating direction of the drive motor becomes a first direction.

6. The method of claim 5, wherein when the rotating direction of the drive motor becomes a second direction different from the first direction, the drive step includes:
   driving the drive motor to rotate in the second direction to exceed the drive angle; and
   driving the drive motor to rotate in the first direction.

7. The method of claim 6, wherein, when a driving motor is driven to rotate in the first direction, the driving motor is driven in a plurality of steps.

8. The method of claim 7, wherein the second motion conversion mechanism includes a cam follower provided on the moving body and a shaft provided on the stage, and
   wherein the first direction of the driving motor is a direction in which the moving body is moved such that the cam follower and the shaft are contacted with each other.

9. The method of claim 5, wherein, when the driving motor is driven to rotate in the first direction, the driving motor is driven in a plurality of steps.

10. The method of claim 5, wherein the second motion conversion mechanism includes a cam follower provided on the moving body and a shaft provided on the stage, and
    wherein the first direction of the driving motor is a direction in which the moving body is moved such that the cam follower and the shaft are contacted with each other.

11. The method of claim 1, wherein, in the second correction step, the second correction value is obtained based on an error for each predetermined pitch within an alignment range.

12. The method of claim 1, wherein, in the drive step, whether a requested correction is a fine correction or a rough correction is determined based on the drive angle of the stage.

13. The method of claim 1, wherein, in the drive step, when a requested correction is determined to be a fine correction, alignment is completed when a rotating direction of the drive motor becomes a first direction.

14. A placement apparatus comprising:
    a stage configured to place a target object thereon;
    a support table configured to support the stage to be rotatable forward and backward;
    a rotary drive mechanism configured to rotate the stage and including a first motion conversion mechanism configured to convert a rotary motion of a drive motor into a linear motion of a moving body and a second motion conversion mechanism configured to convert a linear motion of the moving body into a rotary motion of the stage; and
    a controller configured to control the rotary drive mechanism,
    wherein the controller is configured to execute:
    a first correction step of calculating a first correction value of a drive angle of the stage for a linear movement amount of the moving body;
    a second correction step of obtaining a second correction value based on an error for each predetermined pitch; and
    a drive step of rotationally driving the stage based on the first correction value and the second correction value obtained in the first correction step and the second correction step, respectively.

15. An inspection apparatus comprising the placement apparatus of claim 14.

\* \* \* \* \*